(12) United States Patent
Machi et al.

(10) Patent No.: US 9,824,796 B2
(45) Date of Patent: Nov. 21, 2017

(54) OXIDE SUPERCONDUCTOR AND METHOD FOR MANUFACTURING SAME

(71) Applicants: International Superconductivity Technology Center, Kawasaki-shi, Kanagawa (JP); FUJIKURA LTD., Tokyo (JP); SWCC SHOWA CABLE SYSTEMS CO., LTD., Tokyo (JP); FURUKAWA ELECTRIC CO., LTD., Tokyo (JP)

(72) Inventors: Takato Machi, Tokyo (JP); Tomo Yoshida, Funabashi (JP); Tatsunori Nakamura, Sagamihara (JP); Kota Katayama, Nikko (JP); Koichi Nakao, Tokyo (JP); Keiichi Tanabe, Kawasaki (JP)

(73) Assignees: FUJIKURA LTD., Tokyo (JP); SWCC SHOWA CABLE SYSTEMS CO., LTD., Tokyo (JP); FURUKAWA ELECTRIC CO., LTD., Tokyo (JP)

( * ) Notice: Subject to any disclaimer, the term of this patent is extended or adjusted under 35 U.S.C. 154(b) by 0 days.

(21) Appl. No.: 14/894,404

(22) PCT Filed: May 28, 2014

(86) PCT No.: PCT/JP2014/064121
§ 371 (c)(1),
(2) Date: Nov. 27, 2015

(87) PCT Pub. No.: WO2014/192806
PCT Pub. Date: Dec. 4, 2014

(65) Prior Publication Data
US 2016/0125977 A1 May 5, 2016

(30) Foreign Application Priority Data
May 28, 2013 (JP) ................. 2013-112183

(51) Int. Cl.
*H01B 12/00* (2006.01)
*H01B 12/04* (2006.01)
(Continued)

(52) U.S. Cl.
CPC ......... *H01B 12/04* (2013.01); *H01B 13/0009* (2013.01); *H01L 39/143* (2013.01); *H01L 39/248* (2013.01); *H01L 39/2467* (2013.01)

(58) Field of Classification Search
CPC ........ H01B 12/04; H01B 12/06; H01B 13/00; H01B 13/0009; H01F 6/02; H01F 6/06;
(Continued)

(56) References Cited

U.S. PATENT DOCUMENTS 4,865,686 A 9/1989 Sinohara
2007/0145100 A1* 6/2007 Suzuki ................. H01L 39/143
228/101
(Continued)

FOREIGN PATENT DOCUMENTS

EP 1788641 A2 5/2007
JP 2007-141688 A 6/2007
(Continued)

OTHER PUBLICATIONS

Communication dated Apr. 20, 2016 from the European Patent Office in counterpart application No. 14804085.0.
(Continued)

*Primary Examiner* — Timothy Thompson
*Assistant Examiner* — Guillermo Egoavil
(74) *Attorney, Agent, or Firm* — Sughrue Mion, PLLC

(57) ABSTRACT

An oxide superconductor includes: a substrate made of a metal; an insulating intermediate layer provided on the substrate; an oxide superconducting layer provided on the intermediate layer; a metal stabilizing layer provided on the oxide superconducting layer; and a plurality of dividing
(Continued)

grooves which divide the metal stabilizing layer and the oxide superconducting layer along a longitudinal direction of the substrate, reach the inside of the intermediate layer through the oxide superconducting layer from the metal stabilizing layer, and do not reach the substrate. The metal stabilizing layer and the oxide superconducting layer are divided to form a plurality of filament conductors by the plurality of dividing grooves, and in each dividing groove of the plurality of dividing grooves, a width of a groove opening portion of the dividing groove is equal to or greater than a width of a groove bottom portion of the dividing groove.

4 Claims, 11 Drawing Sheets

(51) Int. Cl.
  *H01L 39/14* (2006.01)
  *H01L 39/24* (2006.01)
  *H01B 13/00* (2006.01)
(58) Field of Classification Search
  CPC .............. H01F 27/346; H01F 27/2852; H01F 27/2871; H01L 39/143; H01L 39/248; H01L 39/2467; Y02E 40/642; Y10S 505/704; Y10S 505/705; Y10S 505/879; Y10S 505/08

USPC ......... 174/125, 125.1; 220/101; 257/E39.18; 335/216; 505/211, 230
  See application file for complete search history.

(56) References Cited

U.S. PATENT DOCUMENTS

| | | | |
|---|---|---|---|
| 2009/0170708 A1* | 7/2009 | Funaki | ...................... H01F 6/02 505/211 |
| 2013/0137579 A1* | 5/2013 | Nagasu | .................. H01B 12/02 505/150 |

FOREIGN PATENT DOCUMENTS

| | | | | | |
|---|---|---|---|---|---|
| JP | 2010-282893 | A | | 12/2010 | |
| JP | 2010282893 | A | * | 12/2010 | ........... Y02E 40/642 |
| JP | 2011-181559 | A | | 9/2011 | |
| JP | 2013-004457 | A | | 1/2013 | |
| JP | 2013004457 | A | * | 1/2013 | ........... Y02E 40/642 |

OTHER PUBLICATIONS

Hix et al. "Laser Micromachining of Coated YBa2Cu3O6+x Superconducting Thin Films", Jun. 14, 2004, 11 pages total.
Communication dated Jul. 26, 2016 from the Japanese Patent Office in counterpart application No. 2015-519902.
Communication dated Mar. 1, 2016, issued by the Japan Patent Office in corresponding Japanese Application No. 2015-519902.

* cited by examiner (a)

(b)

OXIDE SUPERCONDUCTOR AND METHOD FOR MANUFACTURING SAME

TECHNICAL FIELD

The present invention relates to an oxide superconductor and a method of manufacturing the same.

This application is a National Stage of International Application No. PCT/JP2014/064121 filed May 28, 2014, claiming priority based on Japanese Patent Application No. 2013-112183 filed May 28, 2013, the contents of all of which are incorporated herein by reference in their entirety.

BACKGROUND ART

A rare-earth-based (RE123-based) oxide superconducting wire has a structure in which an oxide superconducting layer and a metal stabilizing layer are laminated on a tape-shaped metal substrate with an intermediate layer interposed therebetween. Therefore, in order to reduce AC loss, a multi-filament structure needs to be formed by subdividing the oxide superconducting layer.

Hitherto, in order to form a multi-filament structure from a rare-earth-based oxide superconducting wire, a masking tape attached to the surface of the wire is irradiated with a laser having a weak output to partially remove the masking tape, and through the remaining masking tape, chemical etching is performed on a metal stabilizing layer made of Ag and an oxide superconducting layer in two stages. Through the chemical etching, a plurality of dividing grooves are formed to divide the stabilizing layer and the oxide superconducting layer into an arbitrary number of sections, thereby forming a multi-filament structure having a plurality of superconducting filaments.

However, in the method of forming the dividing grooves through etching, there is a limit to a reduction in the groove width, and an over-etched region is likely to be generated in the edge portion of the superconducting filament. For this reason, there are problems of a reduction in critical current and peeling of the superconducting filament.

Specifically, the dividing grooves formed in the oxide superconducting layer become wider than the grooves formed in the metal stabilizing layer in the chemical etching process, and thus it is extremely difficult to allow an effective groove width formed in the oxide superconducting layer to be equal to or less than 100 μm.

In addition, the method of manufacturing the oxide superconducting wire having the multi-filament structure in combination with the masking tape, laser irradiation, and chemical etching described above is limited to a case where the metal stabilizing layer is made of Ag. For example, in a case of using a Cu stabilizing layer, which is most commonly used in an oxide superconducting wire, an etchant which is effective for Cu without causing corrosion of the oxide superconducting wire is not developed in the current situation. Therefore, dividing grooves may not be formed by partially removing Cu through etching.

In addition, as a technique for forming an oxide superconductor having a multi-filament structure by dividing an oxide superconducting layer using laser irradiation, as described in Patent Document 1 below, a technique for dividing an oxide superconducting layer into a plurality of sections in the width direction of the oxide superconducting layer by focusing laser light on the oxide superconducting layer along the longitudinal direction thereof is known.

According to the technique described in Patent Document 1, it is described that while the laser light is focused on the oxide superconducting layer, a molten material in the dividing grooves is blown off by purge gas, such that a multi-filament wire having a structure in which the oxide superconducting layer is divided can be manufactured.

PRIOR ART DOCUMENTS

Patent Documents

[Patent Document 1] Japanese Unexamined Patent Application, First Publication No. 2007-141688

SUMMARY OF THE INVENTION

Problems to be Solved by the Invention

In addition, a method of dividing (scribing) an oxide superconducting layer only through laser irradiation was reported by the Karlsruhe Institute of Technology (KIT) in Germany in 2012. However, in the report by KIT, a fiber laser in the far-infrared region (1030 nm) is used, and thus thermal processing is performed, which results in a reduction in critical current in a superconducting filament after division. In addition, KIT in Germany has conducted a study for reducing the effect of deterioration caused by thermal processing using a picosecond laser. However, the picosecond laser has a light intensity distribution (Gaussian distribution) unique to a fiber laser and a solid-state laser, in which the light intensity distribution is strong at the center of a spot region, on which laser light is focused, and the light intensity distribution becomes weakened toward the periphery. Therefore, the cutting depth is increased toward the center of the spot region of the laser light. That is, cutting cannot be performed at a uniform depth over the spot region of the laser light from the center to the edge. Therefore, when dividing grooves which divide the oxide superconducting layer are formed, the depths of the dividing grooves are not constant, and there is a problem in that the insulation resistance between the superconducting filaments cannot obtain a preferable value. In a method of dividing an oxide superconducting layer while reducing the effect of deterioration caused by thermal processing using a picosecond laser, a technique for forming desired dividing grooves through 20 to 30 times of laser irradiation operations is used, which results in poor productivity. In addition, it is disclosed that even in this method, critical current is deteriorated by approximately 40% after processing.

Even in the description of Patent Document 1, it is described that since the oxide superconducting layer cannot be excavated at a uniform depth over the spot region of the laser light from the center to the peripheral region, in order to completely divide the oxide superconducting layer, there is a need to form dividing grooves having a depth that passes through the oxide superconducting layer and the intermediate layer and reaches the substrate. However, the substrate of the rare-earth-based oxide superconducting wire is formed of an Ni-based alloy having high strength and a high melting point. Therefore, when the dividing grooves that reach the substrate are formed, dross which unavoidably remains on the inside of the dividing grooves becomes conductive dross in which the constituent elements of the substrate, the intermediate layer, and the oxide superconducting layer are mixed. Accordingly, there is a problem in that an object to increase the insulation resistance between the superconducting filaments which are adjacent to each other with the dividing groove interposed therebetween cannot be accomplished.

Therefore, in the technique described in Patent Document 1, a technique for increasing resistance by heating the dross at a high temperature (400° C. to 800° C.) so as to be oxidized is disclosed. However, when the dross is heated in the above temperature range in order to oxidize the dross containing the Ni-based high-melting-point alloy components in a high proportion, there is a problem in that the superconducting properties of the oxide superconducting layer are deteriorated.

In addition, the entirety of the dross containing the Ni-based high-melting-point alloy components in a high proportion may not be oxidized, and instead, only a surface portion of the dross is oxidized. Therefore, metals are connected to each other on the inside of the surface oxide through the substrate made of the Ni alloy, which enables current to pass between the adjacent superconducting filaments. Accordingly, there is a problem in that the insulation resistance between the superconducting filaments cannot be high. In the example described in Patent Document 1, it is described that a resistance value of 25Ω to 210Ω can be obtained after thermal processing. However, a high value as the insulation resistance between the superconducting filaments is not obtained.

In consideration of the above-described background, the inventors repeatedly conducted various research on the type of laser light used to form dividing grooves, phase adjustment of the laser light, polarized state control, optical mask control, an intensity distribution in a laser light irradiation region, and the like. As a result, it was determined that thermal fusion type laser light such as a YAG laser and a continuous-wave laser, which are generally used for fusion cutting, does not achieve a uniform laser light intensity distribution in a spot region of the laser light, and the intensity of a Gaussian component at the center of the spot region is high. This causes unavoidable formation of deep dividing grooves which reach the substrate of the oxide superconducting wire because a region having an extremely high laser intensity is easily generated at the center of the spot region of the laser light even when a rectangular beam is produced by an optical mask. In addition, such a solid-state laser easily generates a strong coherent light component in the peripheral portion of a region on which beam shaping is performed, and thus there is also a problem in that the intensity of the laser light cannot be uniformized due to the effect of the coherent light component.

As a type of gas laser other than the solid-state laser, a $CO_2$ laser is known. The $CO_2$ laser is a continuous-wave laser, and the wavelength thereof reaches 10 μm. Therefore, a lens in an optical system is designed to have an ultimate numerical aperture of NA=1, and the processing precision is determined as λ/NA (λ: wavelength). Therefore, there is a problem in that processing of less than 10 μm scales is impossible.

For example, in a method of manufacturing a rare-earth-based oxide superconducting wire, on a tape-shaped metal substrate, an oxide superconducting layer having a thickness at a level of 1 μm to several μm is formed through an intermediate layer having a plurality of laminated layers with a thickness at a level of several nm to several hundreds of nm, and an Ag protective layer having a thickness at a level of several μm is formed, thereby obtaining the oxide superconducting wire. In a case where dividing grooves are formed on the oxide superconducting wire having this structure by using laser light which cannot uniformize the intensity of the laser light in a laser irradiation region on which beam shaping is performed as described above, there is a problem in that in order to process the dividing grooves having a depth such that the oxide superconducting layer is completely divided, the dividing grooves having a depth that reaches the substrate have to be formed.

In consideration of the above-described circumstances, an object of the present invention is to provide a technique for obtaining an oxide superconductor which can ensure, in a structure in which an oxide superconducting layer is divided by dividing grooves to form a plurality of filament conductors, high insulation resistance between the adjacent filament conductors, and thus have reduced AC loss.

Means for Solving the Problems

From the above-described background, the inventors conducted research on laser light having a more uniform intensity distribution in a laser irradiation region. As a result, the inventors focused on an excimer laser which is a gas laser and is a type of laser in a non-polarized state, and conducted research for forming dividing grooves using the excimer laser.

As a result of the research, it was found that in a case where dividing grooves are formed by a laser in the ultraviolet region such as an excimer laser, dividing grooves having a depth that reaches an intermediate layer through an oxide superconducting layer and does not reach a substrate can be formed. In addition, it was also found that in a case where the laser light in the ultraviolet region is used, photolysis is performed so as to break the molecular structure itself of a layer to be divided other than thermal fusion type fusion cutting in which a fiber laser or the like is used, and thus division can be performed with high precision without impairing the properties of the layer to be divided.

In addition, it was found that when the dividing grooves are formed having a depth which reaches the intermediate layer through the oxide superconducting layer and does not reach the substrate, the insulation resistance between filament conductors that are adjacent to each other with a dividing groove interposed therebetween is dramatically enhanced, which leads to the present invention.

In order to solve the problems, according to a first aspect of the present invention, an oxide superconductor includes: a substrate made of a metal; an insulating intermediate layer provided on the substrate; an oxide superconducting layer provided on the intermediate layer; a metal stabilizing layer provided on the oxide superconducting layer; and a plurality of dividing grooves which divide the metal stabilizing layer and the oxide superconducting layer along a longitudinal direction of the substrate, the dividing grooves reaching an inside of the intermediate layer through the oxide superconducting layer from the metal stabilizing layer, and the dividing grooves not reaching the substrate, in which the metal stabilizing layer and the oxide superconducting layer are divided to form a plurality of filament conductors by the plurality of dividing grooves, and in each dividing groove of the plurality of dividing grooves, a width of a groove opening portion of the dividing groove is equal to or greater than a width of a groove bottom portion of the dividing groove.

In addition, in the oxide superconducting wire according to the aspect, the dividing groove may be formed by laser irradiation so that a groove wall portion of the dividing groove is covered with an insulating coating layer formed of constituent elements of the intermediate layer and the oxide superconducting layer, and the coating layer and the groove bottom portion have insulating properties.

The oxide superconductor according to the aspect has the dividing grooves which divide the insides of the metal stabilizing layer, the oxide superconducting layer, and the intermediate layer and have a depth that does not reach the substrate made of metal and thus form the filament conductors made by dividing the oxide superconducting layer. Therefore, very high resistance can be obtained between the filament conductors which are adjacent to each other with the dividing groove interposed therebetween.

In addition, in the oxide superconductor according to the aspect, the filament conductors are formed only by laser processing without using etching. Therefore, the effect of over-etching is not applied to the filament conductors. Therefore, an oxide superconductor in which the peel strength of the filament conductor is high and the filament conductor having a small amount of reduced critical current can be obtained.

In addition, in the oxide superconductor according to the aspect, in a case of a structure in which the groove wall portion of the dividing groove is covered with the coating layer which is formed of the constituent elements of the intermediate layer and the oxide superconducting layer and has high resistance, incorporation of the constituent components of the substrate does not occur. Therefore, high insulation resistance can be obtained between the filament conductors which are adjacent to each other with the dividing groove interposed therebetween.

In the oxide superconductor according to the aspect, a groove width of the groove bottom portion may be 5 to 100 µm.

In the oxide superconductor according to the aspect, the dividing grooves are formed only by focusing the laser light without using etching. Therefore, the effect of over-etching caused by etching can be eliminated. In addition, the dividing grooves having a width of 5 to 100 µm can be formed with high accuracy corresponding to the shape accuracy of a laser irradiation region of the laser light when the laser light is focused on the oxide superconducting wire to form the dividing grooves.

In the oxide superconductor according to the aspect, in the plurality of filament conductors, a resistance between the filament conductors which are adjacent to each other with the dividing groove interposed therebetween may be 1 MΩcm or more.

In the oxide superconductor according to the aspect, the dividing grooves which have a depth positioned in the intermediate layer so as not to allow the bottom portion of the dividing groove to reach the substrate are formed. Therefore, an oxide superconductor having high resistance between the filament conductors, which cannot be obtained in a technique in which dividing grooves are formed to reach the substrate, can be obtained.

In the oxide superconductor according to the aspect, the intermediate layer may include a textured layer having a high crystal orientation and a cap layer formed on the textured layer, the groove bottom portion may be formed to be positioned inside the cap layer, and the dividing groove may be formed to expose a portion of the cap layer from the groove bottom portion.

In the oxide superconductor according to the aspect, by forming the dividing grooves so as to allow the bottom portion of the dividing groove to be positioned in the cap layer of the intermediate layer, the dividing grooves which allow the bottom portion of the dividing groove to be formed in the cap layer and do not reach the substrate can be formed. Since the filament conductors are divided by the dividing grooves formed to be positioned in the cap layer, high insulation resistance can be obtained between the filament conductors which are adjacent to each other with the dividing groove interposed therebetween.

In order to solve the problems, according to a second aspect of the present invention, a method of manufacturing an oxide superconductor, includes: preparing an oxide superconducting wire including a substrate made of a metal, an insulating intermediate layer provided on the substrate, an oxide superconducting layer provided on the intermediate layer, and a metal stabilizing layer provided on the oxide superconducting layer; dividing the metal stabilizing layer and the oxide superconducting layer by focusing a laser in the ultraviolet region on the oxide superconducting wire from above the metal stabilizing layer; and forming a plurality of dividing grooves in the oxide superconducting wire along a longitudinal direction of the substrate so that the dividing grooves reach an inside of the intermediate layer and do not reach the substrate and a width of a groove opening portion of each dividing groove is greater than a width of a groove bottom portion of the dividing groove, thereby dividing the oxide superconducting layer to form a plurality of filament conductors.

In the method of manufacturing an oxide superconductor according to the aspect, a structure in which the oxide superconducting layer is divided by forming the dividing grooves having a depth that reaches the intermediate layer through the metal stabilizing layer and the oxide superconducting layer by focusing the laser in the ultraviolet region is provided, and thus the plurality of filament conductors can be formed. The filament conductors are divided by the dividing grooves having a depth that reaches the intermediate layer and the insulating intermediate layer is present in the bottom portion of the dividing groove. Therefore, an oxide superconductor having high insulating properties between the filament conductors can be obtained.

In the method of manufacturing an oxide superconductor according to the aspect, a groove wall portion of the dividing groove may be covered with an insulating coating layer formed of constituent elements of the intermediate layer and the oxide superconducting layer.

In the method of manufacturing an oxide superconductor according to the aspect, the filament conductors are divided by the dividing grooves having a depth that reaches the intermediate layer. The insulating intermediate layer is present in the bottom portion of the dividing groove. Furthermore, the groove wall portion is covered with the coating layer which is formed of the constituent elements of the oxide superconducting layer and the intermediate layer and thus has high insulating properties. Accordingly, high insulating properties can be ensured between the filament conductors.

In order to solve the problems, in the method of manufacturing an oxide superconductor according to the aspect, as the laser in the ultraviolet region, a laser which has a top-hat intensity distribution, in which a laser intensity distribution of a tip end of a focusing portion is flat, and has a laser wavelength of 380 nm or lower may be used.

In the method of manufacturing an oxide superconductor according to the aspect, since the laser which has a top-hat intensity distribution, in which the laser intensity distribution of the tip end of the focusing portion is flat, is used, the cutting depths of the dividing grooves cut by the laser can be uniformized. Therefore, the bottom portion of the dividing groove can be reliably formed to be positioned in the intermediate layer while reliably dividing the oxide superconducting layer, and thus the dividing grooves which do not reach the substrate are formed. Therefore, excellent insulating properties can be ensured between the filament conductors which are adjacent to each other with the dividing groove interposed therebetween.

In order to solve the problems, in the method of manufacturing an oxide superconductor according to the aspect, a laser-focused portion of the metal stabilizing layer may be melted and removed by focusing the laser from an outside of the metal stabilizing layer and supplying an assist gas to the metal stabilizing layer, the dividing grooves may be formed by focusing the laser on the oxide superconducting layer and the intermediate layer and melting and removing a laser-focused portion of the oxide superconducting layer and a laser-focused portion of the intermediate layer, and the groove wall portion may be covered with the coating layer.

In the method of manufacturing an oxide superconductor according to the aspect, the metal stabilizing layer is partially melted by the laser and the molten portion of the metal stabilizing layer is removed by the assist gas, such that an upper portion of the dividing groove is formed on the metal stabilizing layer. Thereafter, the oxide superconducting layer and the intermediate layer are partially melted at the upper portion of the dividing groove, and the molten portion of the oxide superconducting layer and the molten portion of the intermediate layer are removed by the assist gas, such that the bottom portion of the dividing groove can be formed. In a state where the oxide superconducting layer and the intermediate layer are melted by the laser, the molten portion of the metal stabilizing layer positioned on the oxide superconducting layer is removed in advance. Therefore, the coating layer which is formed of the constituent elements of the oxide superconducting layer and the intermediate layer and thus has insulating properties remains in the groove wall portion of the dividing groove formed in the oxide superconducting layer and the intermediate layer. In addition, even in the upper portion of the dividing groove formed in the metal stabilizing layer, the groove wall portion is also covered with the coating layer formed of the constituent elements of the oxide superconducting layer and the intermediate layer, and thus the insulating properties between the filament conductors which are adjacent to each other with the dividing groove interposed therebetween can be particularly enhanced.

Effects of Invention

According to the first and second aspects, the oxide superconducting layer is divided by the dividing grooves which divide the metal stabilizing layer, the oxide superconducting layer, and the intermediate layer and have a depth that does not reach the substrate such that the filament conductors are formed. Therefore, very high insulation resistance is obtained between the filament conductors which are adjacent to each other with the dividing groove interposed therebetween. Particularly, the groove wall portion of the dividing groove is covered with the coating layer which is formed of the constituent elements of the intermediate layer and the oxide superconducting layer and thus has high insulation resistance, and the constituent elements of the intermediate layer are present in the bottom portion of the dividing groove, and thus incorporation of the constituent components of the substrate does not occur. Therefore, high insulation resistance can be obtained between the filament conductors which are adjacent to each other with the dividing groove interposed therebetween.

In addition, since the dividing grooves are formed only by laser processing without using etching, the effect of over-etching can be eliminated. Furthermore, an oxide superconductor in which the peel strength of the filament conductor is high and the filament conductor having a small amount of reduced critical current can be provided.

BRIEF DESCRIPTION OF THE DRAWINGS

FIG. 5(a) is a perspective view illustrating the oxide superconducting wire before processing. FIG. 5(b) is a perspective view illustrating a state where a metal stabilizing layer is removed. FIG. 5(c) is a perspective view illustrating a state where an oxide superconducting layer is removed. FIG. 5(d) is a perspective view illustrating a state where a portion of an intermediate layer is removed.

FIG. 6(a) is a schematic view illustrating a beam intensity distribution of an excimer laser. FIG. 6(b) is a schematic view illustrating a beam intensity distribution of a YAG laser.

EMBODIMENTS FOR CARRYING OUT THE INVENTION

Hereinafter, an oxide superconductor according to an embodiment of the present invention will be described with reference to the drawings.

Figure 1:
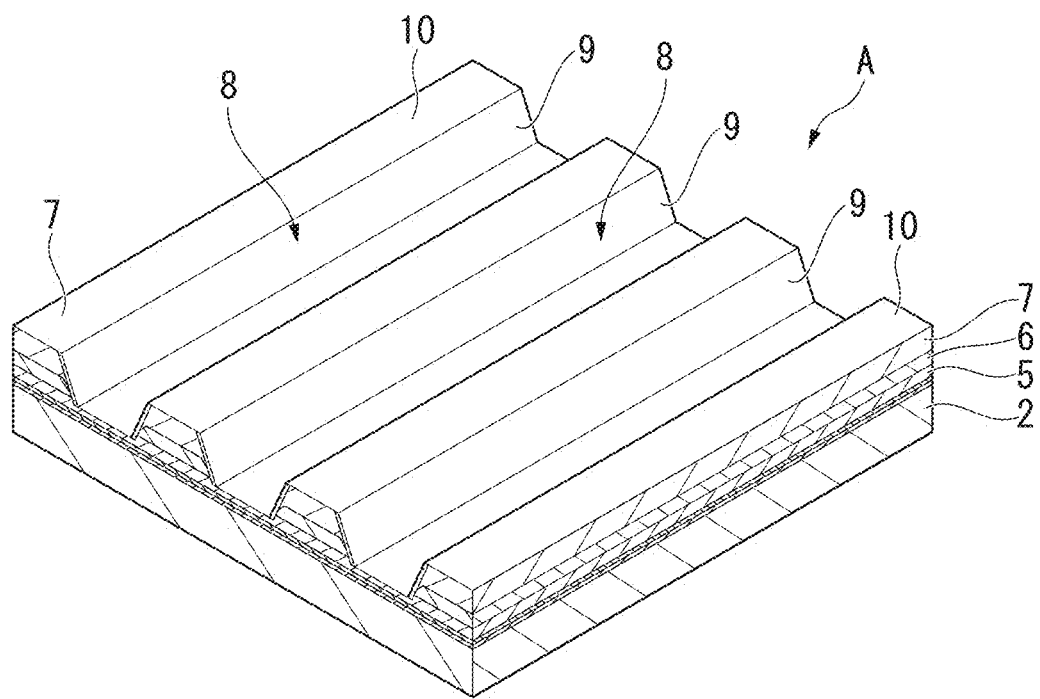
FIG. 1 is a perspective view illustrating an example of an oxide superconductor which is formed by forming a plurality of filament conductors through the formation of dividing grooves in an oxide superconducting wire according to an embodiment of the present invention.
Figure 2:
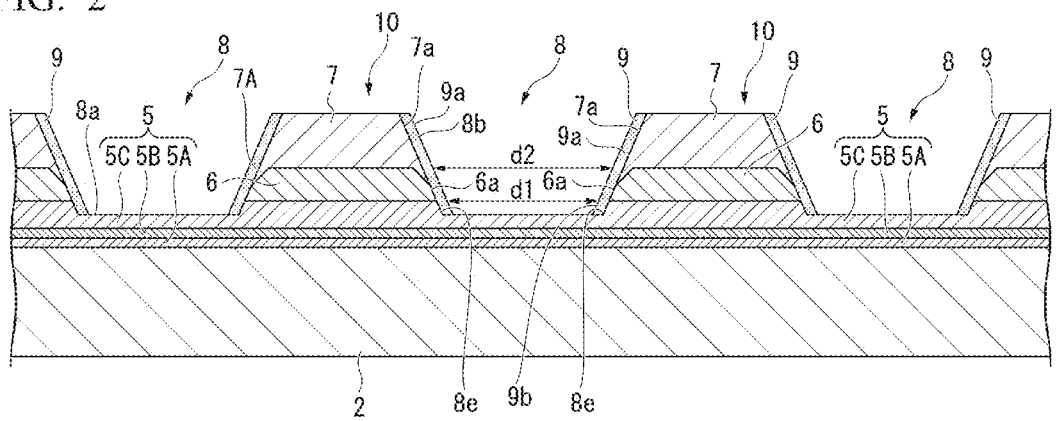
FIG. 2 is a sectional structural view partially illustrating the oxide superconductor according to the embodiment of the present invention.

FIG. 1 is a perspective view illustrating an example of the oxide superconductor according to the embodiment of the present invention, in which a plurality of filament conductors are formed by forming dividing grooves, and FIG. 2 is a sectional structural view partially illustrating the oxide superconductor according to the embodiment. An oxide superconductor A of this embodiment is manufactured by processing an oxide superconducting wire B having a structure illustrated in FIG. 3 by using a laser-processing apparatus C illustrated in FIG. 4. There may be cases where main portions of the oxide superconductor A and the oxide superconducting wire B illustrated in the figures are enlarged for easy understanding of the features of the present invention, and the dimensional ratios of each constituent element are not limited to be the same as those in practice.

Figure 3:
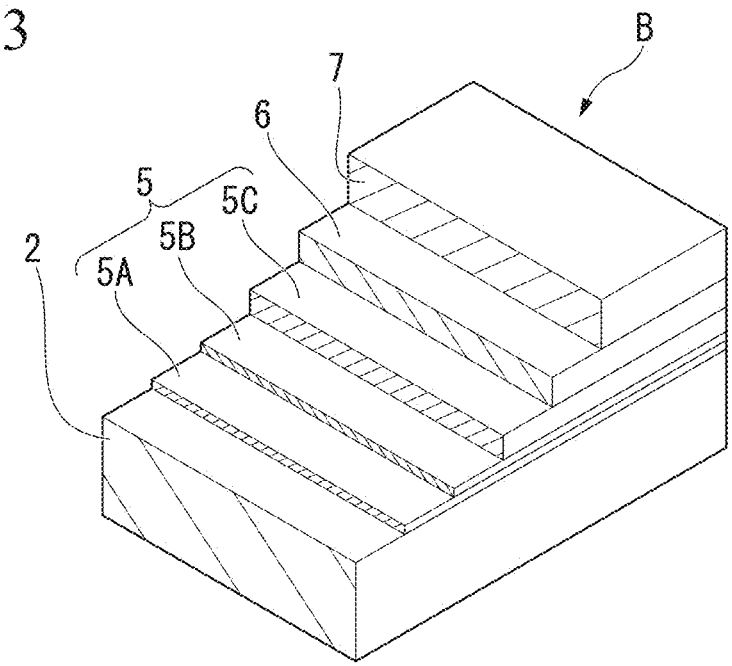
FIG. 3 is a perspective view illustrating an example of the oxide superconducting wire before the dividing grooves are formed according to the embodiment of the present invention.

The oxide superconducting wire B before processing illustrated in FIG. 3 includes an intermediate layer 5 laminated on a substrate 2, an oxide superconducting layer 6 laminated on the intermediate layer 5, and a metal stabilizing layer 7 laminated on the oxide superconducting layer 6.

The substrate 2 is preferably in a tape shape for a long length, and is formed of a metal material having excellent heat resistance and high strength, such as a nickel alloy represented by HASTELLOY (trade name manufactured by Haynes International, Inc., registered trademark). Among the types of HASTELLOY, any type of HASTELLOY B, C, G, N, and W series and the like, which have varying amounts of molybdenum, chromium, iron, cobalt, and the like, may be used. In addition, as the substrate 2, a textured Ni—W alloy tape substrate in which a texture is introduced into a nickel alloy may be applied. The thickness of the substrate 2 may be appropriately adjusted depending on the purpose, and may be in a range of 10 to 500 μm.

As the structure of the intermediate layer 5, as an example, a structure including an anti-diffusion layer 5A, a textured layer 5B, and a cap layer 5C may be exemplified.

The anti-diffusion layer 5A is formed for the purpose of preventing the diffusion of constituent elements of the substrate 2, and is formed of silicon nitride ($Si_3N_4$), aluminum oxide ($Al_2O_3$), GZO ($Gd_2Zr_2O_7$), or the like, for example, to have a thickness of 10 to 400 nm by a film-forming method such as a sputtering method.

In addition, a bed layer may also be formed on the anti-diffusion layer 5A. The bed layer is used to obtain high heat resistance, a reduction in interfacial reactivity, and the texture of a film formed on the bed layer. The bed layer is formed of $Y_2O_3$, $Er_2O_3$, $CeO_2$, $Dy_2O_3$, $Er_2O_3$, $Eu_2O_3$, $Ho_2O_3$, $La_2O_3$, or the like. The bed layer is formed by a film-forming method such as a sputtering method, and the thickness thereof is, for example, 10 to 100 nm.

The textured layer 5B is formed of a biaxially textured material in order to control the texture of the cap layer 5C formed on the textured layer 5B. As the material of the textured layer 5B, specifically, metal oxides such as $Gd_2Zr_2O_7$, MgO, $ZrO_2$—$Y_2O_3$(YSZ), $SrTiO_3$, $CeO_2$, $Y_2O_3$, $Al_2O_3$, $Gd_2O_3$, $Zr_2O_3$, $Ho_2O_3$, or $Nd_2O_3$ may be exemplified.

When the textured layer 5B is formed to have a good biaxial texture (high crystal orientation) by an ion-beam-assisted deposition (IBAD) method, the texture of the cap layer 5C can be enhanced (the cap layer 5C having a high crystal orientation is obtained). Furthermore, the texture of the oxide superconducting layer 6 formed on the cap layer 5C is enhanced (the oxide superconducting layer 6 having a high crystal orientation is obtained), and thus excellent superconducting properties can be exhibited.

The cap layer 5C is formed on the surface of the above-described textured layer 5B, and is formed of a material which enables grains to show self-epitaxy in an in-plane direction. Specifically, the cap layer 5C is formed of $CeO_2$, $Y_2O_3$, $Al_2O_3$, $Gd_2O_3$, $ZrO_2$, YSZ, $Ho_2O_3$, $Nd_2O_3$, $LaMnO_3$, or the like.

A $CeO_2$ layer used in the cap layer 5C can be formed at a high film-forming rate by a pulsed laser deposition (PLD) method, a sputtering method, or the like, and can obtain a good texture. The film thickness of the cap layer 5C may be 50 to 5000 nm, and is preferably formed in a range of approximately 300 to 800 nm.

As the material of the oxide superconducting layer 6, a well-known material used in a high-temperature superconductor is employed. Specifically, a material such as $REBa_2Cu_3O_y$ (RE is one or two or more rare earth materials among Sc, Y, La, Ce, Pr, Nd, Pm, Sm, Eu, Gd, Tb, Dy, Ho, Er, Tm, Yb, and Lu) may be exemplified. As the oxide superconducting layer 6, Y123 ($YBa_2Cu_3O_{7-x}$) or Gd123 ($GdBa_2Cu_3O_{7-x}$) may be exemplified (x in the composition formula represents oxygen deficiency).

The oxide superconducting layer 6 may be laminated on the intermediate layer 5 by a physical vapor deposition method such as a sputtering method, a vacuum deposition method, a laser deposition method, an electron beam deposition method, and a chemical vapor deposition (CVD) method, a metal-organic decomposition (MOD) method, or the like. Regarding the formation of the oxide superconducting layer 6, from the viewpoint of productivity, a pulsed laser deposition (PLD) method, a trifluoroacetic acid-metal organic deposition (TFA-MOD) method, or a CVD method may be used.

The metal stabilizing layer (protective layer) 7 is formed of a good conductive material such as Ag or an Ag alloy and is formed as a layer having low contact resistance and high affinity to the oxide superconducting layer 6. In addition, the reason why the metal stabilizing layer 7 is formed of Ag is that in an oxygen annealing process in which the oxide superconducting layer 6 is doped with oxygen, oxygen easily penetrates into the oxide superconducting layer 6. The primary material of the oxide superconducting layer manufactured by the film-forming method is an insulator. However, the oxide superconducting layer having a crystal structure by allowing oxygen to be incorporated thereinto by the annealing process is formed and exhibits superconducting properties. In order to form the metal stabilizing layer 7, the thickness of the metal stabilizing layer 7 can be formed to approximately 1 to 30 μm by employing the film-forming method such as a sputtering method.

Although not illustrated in FIG. 3, the metal stabilizing layer 7 may act as a first metal stabilizing layer 7, and a second metal stabilizing layer may be formed on the metal stabilizing layer 7. The second metal stabilizing layer is preferably formed of a relatively cheap conductive metal material including copper, a copper alloy such as a Cu—Zn alloy and a Cu—Ni alloy, aluminum, an aluminum alloy, and stainless steel. The second metal stabilizing layer functions as a bypass for commutating current of the oxide superconducting layer 6 along with the first metal stabilizing layer 7 when the oxide superconducting layer 6 is to be transitioned to a normal conducting state from a superconducting state. In addition, in a case where the oxide superconductor A is used in a superconducting fault current limiter, the stabilizing layer is used to immediately suppress overcurrent generated when normal conducting transition occurs or during a transition to the normal conducting state. In the case of this purpose, as the material used in the second metal stabilizlayer, for example, a high-resistance metal such as an Ni-based alloy including Ni—Cr or the like may be employed. The thickness of the second metal stabilizing layer may be, for example, 10 to 300 μm.

The oxide superconductor A having the structure illustrated in FIGS. 1 and 2 is manufactured by forming a plurality of dividing grooves 8 in the width direction of the oxide superconducting layer 6 along the longitudinal direction of the oxide superconducting layer 6 so as to divide the oxide superconducting layer 6 of the oxide superconducting wire B illustrated in FIG. 3. In FIG. 1, a structure in which the oxide superconducting layer 6 is divided into four filament conductors 10 by three dividing grooves 8 formed at equal intervals in the width direction of the oxide superconducting wire B is illustrated.

The dividing grooves 8 penetrate the metal stabilizing layer 7 and the oxide superconducting layer 6 in the thickness direction of the metal stabilizing layer 7 and the oxide superconducting layer 6, and are formed so that a bottom portion 8a of the dividing groove 8 is positioned partway through the intermediate layer 5 (the bottom portion 8a of the dividing groove 8 is formed to be positioned in the intermediate layer 5 in the thickness direction of the oxide superconducting wire B). In this embodiment, specifically, the bottom portion 8a of the dividing groove 8 is formed to reach the cap layer 5C which is a portion of the intermediate layer 5 (the bottom portion 8a of the dividing groove 8 is formed to be positioned in the cap layer 5C which is a portion of the intermediate layer 5). In addition, the bottom portion 8a of the dividing groove 8 is preferably positioned in a bottom region of the cap layer 5C in a state of not reaching the textured layer 5B and the anti-diffusion layer 5A.

The reason is that as the structure of a general oxide superconducting wire B, many structures are formed so that the cap layer 5C is thick among the anti-diffusion layer 5A, the textured layer 5B, and the cap layer 5C formed below the oxide superconducting layer 6. For example, it is known that the oxide superconducting wire B is formed so that the anti-diffusion layer 5A has a thickness of approximately several tens of nm to 100 nm, the textured layer 5B has a thickness of approximately 5 nm to 10 nm, and the cap layer 5C has a thickness of approximately 200 nm to 500 nm.

This is for the following reasons (1) to (3).

(1) The film-forming rate of an IBAD method used to form the textured layer 5B which is biaxially textured is low, and for example, in a current technique to form the textured layer 5B, a biaxially textured film having a small thickness of approximately 5 nm to 10 nm is obtained as the textured layer 5B made of MgO.

(2) In order to suppress the movement of elements from the substrate 2 due to thermal diffusion so as not to apply the effect of the element diffusion to the oxide superconducting layer 6, the anti-diffusion layer 5A needs to have a thickness of approximately several tens of nm to 100 nm.

(3) In order to obtain the cap layer 5C having an excellent texture on the textured layer 5B that is biaxially textured, the cap layer 5C needs to have a thickness of approximately several hundreds of nm.

In consideration of the circumstances of (1) to (3), a structure in which the bottom portion 8a of the dividing groove 8 is formed to be positioned in the range of the cap layer 5C and the dividing groove 8 does not reach the substrate 2 is a preferable structure.

In addition, by changing the structure in which the anti-diffusion layer 5A and the textured layer 5B are formed on the substrate 2, a metal substrate in which Ni is formed on textured Ni—W, textured Ni, and textured Cu may also be used. Therefore, the oxide superconductor may also be formed by forming the cap layer 5C on such as a tape material and laminating the oxide superconducting layer 6 and the metal stabilizing layer 7 on the textured layer 5C. In the structure of the oxide superconductor, by forming the dividing groove 8 having a depth that reaches the inside of the cap layer 5C and processing the groove bottom portion of the dividing groove 8 to be positioned in a portion of the cap layer 5C using a laser, a desired structure can be obtained.

The dividing grooves 8 are formed in a shape in which the groove width of an opening portion 8b of the dividing groove 8 is greater than the width of the bottom portion 8a of the dividing groove 8 (a wider upper shape), and a plurality of the dividing grooves 8 are formed at equal intervals in the width direction of the oxide superconducting wire B. In this embodiment, a state where three dividing grooves 8 are formed in the width direction of the oxide superconducting conductor A is illustrated.

The oxide superconducting wire B is generally formed in a tape shape having a width of approximately 10 mm or a width of approximately 5 mm. Therefore, in consideration of the width of a region (laser-focused portion) on which the above-mentioned laser is focused in the oxide superconducting wire B, the dividing groove 8 is preferably formed so that the width of the bottom portion 8a is approximately 5 μm or more and 100 μm or less. In addition, in a case where the width of the bottom portion of a groove portion which divides the metal stabilizing layer 7 in the dividing groove 8 is defined as d2 and the width of the bottom portion of a groove portion which divides the oxide superconducting layer 6 is defined as d1, it is preferable that a relationship of $d2/d1 \geq 1$ be satisfied. Here, the width d2 is the groove width of the dividing groove 8 at a position on a plane parallel to the upper surface of the substrate 2 and on a plane where the bottom surface of the metal stabilizing layer 7 and the upper surface of the oxide superconducting layer 6 are in contact. In addition, the width d1 is the groove width of the dividing groove 8 at a position on the plane parallel to the upper surface of the substrate 2 and on a plane where the bottom surface of the oxide superconducting layer 6 and the upper surface of the intermediate layer 5 are in contact. That is, the dividing groove 8 forms a groove having a sectional shape in which the width d2 at the position on the plane closer to the groove opening portion is equal to or greater than the width d1 at the position on the plane closer to the groove bottom portion of the dividing groove 8.

The reason that the shape of the dividing groove 8 is formed to satisfy the relationship of $d2/d1 \geq 1$ is as follows.

When dividing grooves are manufactured by a scribing method which uses both laser irradiation and chemical etching as in a method according to the related art, there is a tendency for the peel strength of a superconducting filament divided by the dividing grooves to decrease to substantially half the peel strength before the dividing grooves are formed. One of the reasons is that in a case of $d2/d1<1$, both inner wall portions of the dividing groove enter an overhanging state (a state where a protrusion is formed) of being inclined toward the inside of the dividing groove. Liquid nitrogen infiltrates into the overhanging portion and expands during cooling. In a case where expansion of the liquid nitrogen is repeated whenever a superconductor is cooled, a pressure is applied to the superconducting filament in a direction to be peeled off by the expanded liquid nitrogen. As described above, it is thought that such ease of peeling of the filament is one of the reasons for a reduction in the peel strength of the superconducting filament. In addition, in a case where the low temperature of an oxide superconducting layer is returned to room temperature, when moisture infiltrates into the overhanging portion of the inner wall, the moisture cannot escape from the overhanging portion. When the oxide superconducting wire is cooled to a low temperature in the state where the moisture infiltrates into the overhanging portion, there is concern that the moisture in the overhanging portion expands and the superconducting filaments may be peeled off. Furthermore, in the case of d2/d1<1, the area of the oxide superconducting layer is largely reduced, and thus there is a problem in that critical current loss is increased.

Therefore, it is preferable that, in order to form the dividing grooves 8 by focusing the laser light on the oxide superconducting layer so as to allow the groove to completely divide the oxide superconducting layer 6 in the thickness direction of the oxide superconducting layer 6 and not to reach the substrate 2, processing conditions be set so that the laser that is used stops partway in the thickness direction of the cap layer 5C. In addition, in order to perform laser processing so as to stop the dividing groove 8 partway in the thickness direction of the cap layer 5C as described above, a laser having a wavelength in the ultraviolet region is preferably used. As the laser having a wavelength in the ultraviolet region, a top-hat excimer laser, which can emit energy as uniform as possible to a beam irradiation region of the oxide superconducting wire on which the laser is focused, is preferably used. By specifying the conditions under which division is performed by the excimer laser, a structure in which the groove bottom portion 8a of the dividing groove 8 is formed partway through the cap layer 5C so as not to allow the groove to reach the substrate 2 can be obtained. Furthermore, the dividing grooves 8 capable of completely dividing the oxide superconducting layer 6 can be formed. Depending on the circumstances regarding the division performed by excimer laser, the dividing groove 8 may reach the textured layer 5B or the anti-diffusion layer 5A slightly over the cap layer 5C. However, it is preferable that the bottom portion 8a of the dividing groove 8 do not reach the substrate 2.

On the groove wall portion of the dividing groove 8, a coating layer 9 which is formed of dross from the elements of the oxide superconducting layer 6 and the cap layer 5C is formed. The coating layer 9 covers an end surface 7a of the metal stabilizing layer 7 positioned at both ends of the dividing groove 8 in the width direction thereof with the upper portion of the coating layer 9. Furthermore, the coating layer 9 covers an end surface 6a of the oxide superconducting layer 6 with a portion of the dividing groove 8 that is lower than the end surface 7a, and covers an inner edge portion 8e of the width-direction end edge of the bottom portion 8a of the dividing groove 8 with a further lower end thereof such that the end surface 7a, the end surface 6a, and the inner edge portion 8e are integrally coated.

As described later in detail, in a case where the dividing groove 8 is formed by focusing the laser in the ultraviolet region (for example, pulsed excimer laser light having a wavelength of 248 nm) on the oxide superconducting wire from the upper side of the metal stabilizing layer 7, the coating layer 9 is formed while ejecting assist gas toward the dividing groove 8 during the formation simultaneously with the laser irradiation and blowing off a molten material. Therefore, when the metal stabilizing layer 7 made of Ag is initially divided by the laser, almost all Ag are initially removed by the assist gas. Thereafter, when the oxide superconducting layer 6 and the intermediate layer 5 are divided by the laser irradiation, the layers of the oxide superconducting layer 6 and the intermediate layer 5 are removed into a groove shape. However, while the bottom portion of the dividing groove 8 is formed, the constituent elements of the oxide superconducting layer 6 and the constituent elements of the intermediate layer 5 are sequentially removed as the division of the oxide superconducting wire proceeds.

In this case, as the laser light irradiation proceeds, the constituent elements of the oxide superconducting layer 6 and the constituent elements of the intermediate layer 5 are sequentially deposited on the inner wall surface of the dividing groove 8 as a main component, and thus the coating layer 9 mainly formed of the constituent elements of the oxide superconducting layer 6 and the intermediate layer 5 can be formed as the coating layer 9 on both inner wall portions of the dividing groove 8. In addition, as illustrated in FIG. 2, in a portion of the dividing groove formed at the bottom portion of the metal stabilizing layer 7, a partial coating layer 7A which is formed by slight elution of a molten material of the constituent elements of the metal stabilizing layer 7 toward the end surface of the oxide superconducting layer 6 is formed. The coating layer 9 which includes the partial coating layer 7A and covers the end surface 7a of the metal stabilizing layer 7 and the end surface 6a of the oxide superconducting layer 6 extends to cover both wall portions of the dividing groove 8.

Figure 4:
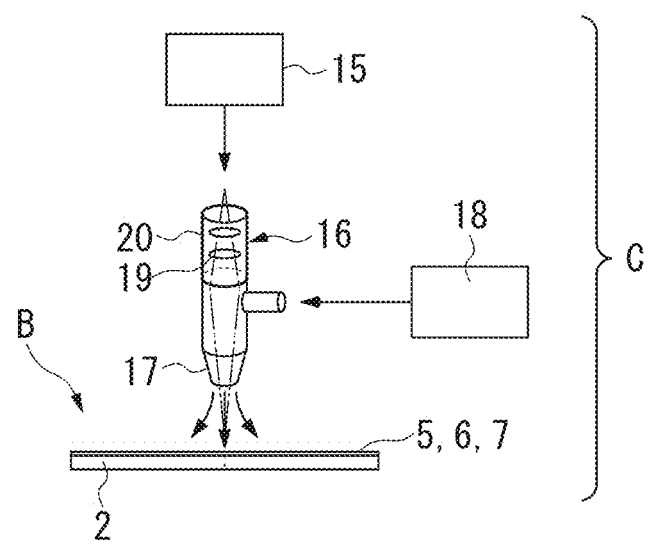
FIG. 4 is a structural view illustrating an example of a laser-processing apparatus used in a case of forming the dividing grooves according to the embodiment of the present invention.

FIG. 4 is a view schematically illustrating a laser-processing apparatus C for manufacturing the oxide superconductor A having the structure illustrated in FIGS. 1 and 2 by focusing laser light on the oxide superconducting wire B having the structure illustrated in FIG. 3. The laser-processing apparatus C of FIG. 4 mainly includes an excimer laser-generating device 15, a cylindrical guiding portion 16 which guides an excimer laser generated by the generating device 15, a nozzle body 17 which is connected to the lower portion of the guiding portion 16, and an assist gas supply source 18 which is connected to a portion of the nozzle body 17.

As the laser-generating device 15, an apparatus which generates an excimer laser that is a laser in the ultraviolet region (a wavelength of 380 nm or lower) may also be used. Otherwise, a third harmonic YAG laser which has a top-hat-shaped laser light power intensity distribution by adjusting an optical system may also be used.

In addition, since the laser processing precision is determined as $\lambda/NA$ ($\lambda$: wavelength, NA: numerical aperture), as the wavelength, a wavelength which is made as short as possible is effective. In addition, a top-hat shape as the laser light power intensity distribution and high output are required of the laser. Accordingly, there is an advantage that the width of a rectangular beam for each laser irradiation operation can be increased, and thus the processing rate of the oxide superconducting wire can be increased. In addition, in a case where a YAG laser is used and the output thereof is weakened, the number of cutting operations performed on the oxide superconducting wire by the laser may be increased to cope with a reduction in the output.

Inside the guiding portion 16, an optical device 20 having a plurality of optical lenses is provided to narrow the excimer laser light guided from the generating device 15 to an appropriate beam diameter for the tip end of the nozzle body 17.

The optical device 20 narrows the beam diameter of the excimer laser and focuses the laser beam on a region having a predetermined size by adjusting the relative positions of the optical lenses, optical masks, and the like provided in the optical device 20, thereby forming an irradiation region having a desired size. In addition, the optical device 20 can supply a desired ejection amount of the assist gas such as helium gas, nitrogen gas, argon gas, or air to the nozzle pair 17 from the assist gas supply source 18 connected to the nozzle body 17. Moreover, the optical device 20 is configured to allow laser processing while supplying the assist gas to a laser beam irradiation position from the tip end of the nozzle body 17.

As illustrated in FIG. 4, the tip end of the nozzle body 17 is configured to focus the laser light on the oxide superconducting wire B, which is to be processed and is horizontally supported, from immediately thereabove.

Furthermore, the tip end of the nozzle body 17 is configured to eject the assist gas toward the laser irradiation position (laser irradiation portion) of the oxide superconducting wire B from immediately thereabove (at an angle of approximately 90° with respect to the oxide superconducting wire B) so as to blow off and remove a molten material that is present in a region processed by the laser beam. In addition, a configuration is preferable in which, in a stand that supports the nozzle body 17, an angle adjustment mechanism (not illustrated) is provided so as to be able to choose whether to eject the assist gas in an immediately downward direction from the tip end of the nozzle body 17 so as to form an ejection angle of approximately 90° with respect to the position irradiated with the laser light, or eject the assist gas in an inclined direction at a predetermined angle.

In order to process the oxide superconducting wire B having the structure illustrated in FIG. 3 by using the laser-processing apparatus C, the oxide superconducting wire B is wound around a feed reel, the oxide superconducting wire B is horizontally unwound from the feed reel, and the oxide superconducting wire B is wound around a winding reel. Furthermore, in a state where the oxide superconducting wire B is unwound from the feed reel, the oxide superconducting wire B is disposed so that the metal stabilizing layer 7 is positioned on the upper side, and the laser light is focused on the oxide superconducting wire B from above the oxide superconducting wire B that is horizontally supported. In this case, by adjusting the optical lenses, optical masks, or the like of the optical device 20, the laser is focused so that the laser light irradiation region (laser-focused portion) has a diameter of approximately 5 µm to 100 µm. Furthermore, by moving the oxide superconducting wire B at a constant rate from the feed reel toward the winding reel, the dividing grooves 8 which divide the oxide superconducting wire 6 of the oxide superconducting wire B are formed along the longitudinal direction of the oxide superconducting wire B. Here, the region on which the laser light is focused (laser-focused portion) can be adjusted to a rectangular shape, an oval shape, or a circular shape by using the optical mask or a cylindrical lens. As the laser, pulsed laser light in the ultraviolet region which has a uniform laser light intensity distribution over the irradiation region and has low coherence in a beam edge, for example, a pulsed excimer laser is preferably used.

Next, an example of a method of processing the oxide superconducting wire B will be described below on the basis of FIGS. 5(a) to 5(d).

Figure 5:
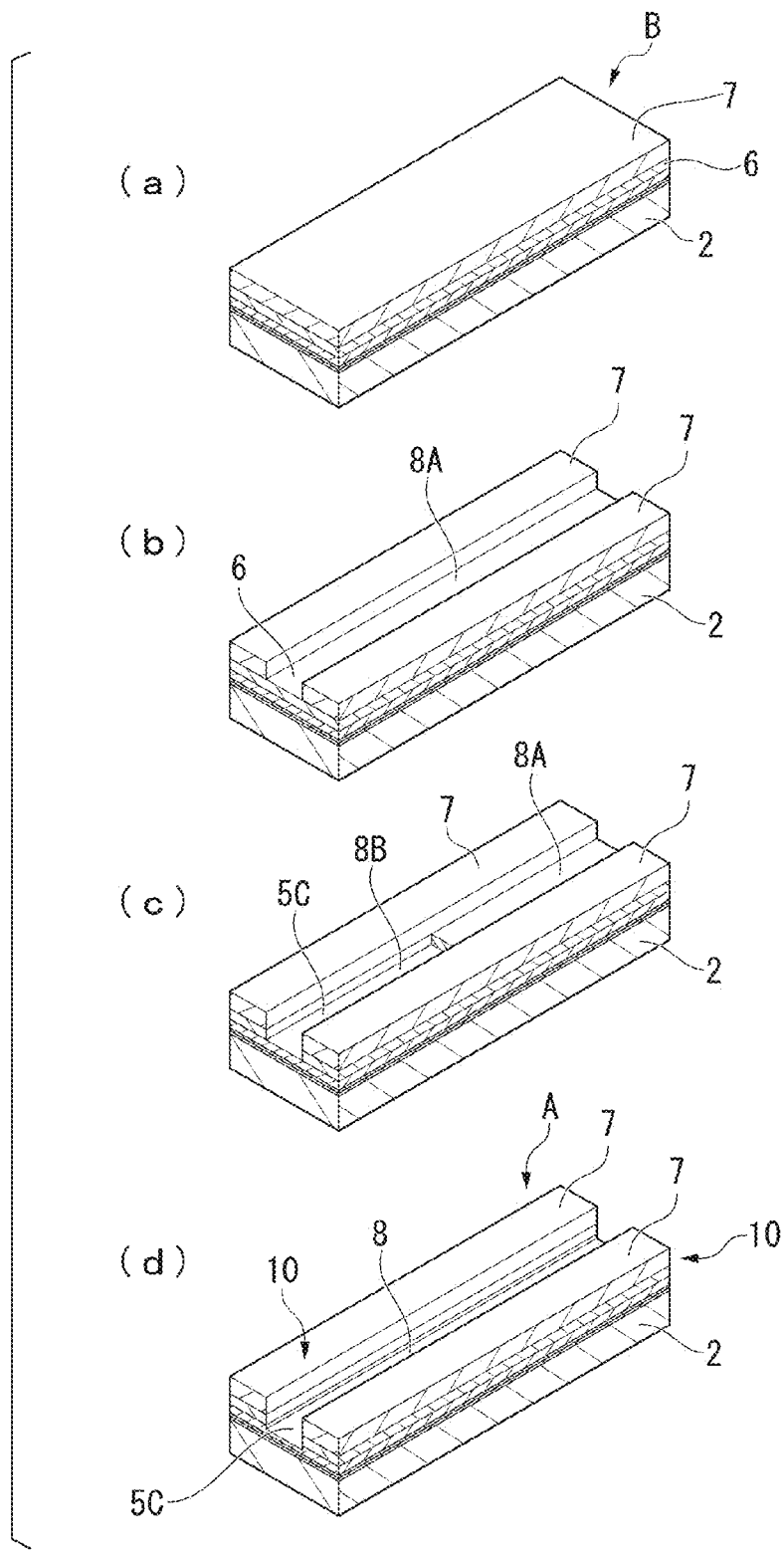
FIG. 5 illustrates a process procedure of a method of forming the dividing groove by irradiating the oxide superconducting wire with laser light according to the embodiment of the present invention.

When the laser light is focused on the metal stabilizing layer 7 of the oxide superconducting wire B illustrated in FIG. 5(a), as the oxide superconducting wire B is moved, the metal stabilizing layer 7 is sequentially cut in the longitudinal direction of the oxide superconducting wire B along the width of a laser irradiation region on which the laser light is focused. In addition, an upper portion 8A of a dividing groove is formed.

Next, as illustrated in FIGS. 5(b) to 5(c), when the laser light is focused on the oxide superconducting layer 6 positioned under the metal stabilizing layer 7, as the oxide superconducting wire B is moved, the oxide superconducting layer 6 and the cap layer 5C are cut in the longitudinal direction of the oxide superconducting wire B along the width of a region on which the laser light is focused. In addition, a bottom portion 8B of the dividing groove is formed. Accordingly, as illustrated in FIG. 5(d), the dividing groove 8 which reaches the metal stabilizing layer 7, the oxide superconducting layer 6, and the cap layer 5C and divides each oxide superconducting layer 6 is formed. As a result, the oxide superconducting layer 6 is divided by the dividing groove 8, and filament conductors 10 are formed on both sides of the dividing groove 8.

Here, by supplying the assist gas in a state where the upper portion 8A of the dividing groove 8 is formed in the metal stabilizing layer 7, most of melted Ag can be blown off and removed. After the upper portion 8A of the dividing groove 8 is formed in the metal stabilizing layer 7, laser light irradiation is resumed, and when the oxide superconducting layer 6 and the intermediate layer 5 which are at deeper positions in the thickness direction of the oxide superconducting wire B are divided, most of the constituent elements of the metal stabilizing layer 7 in the upper portion 8A of the dividing groove 8 are removed. Therefore, when the oxide superconducting layer 6 and the intermediate layer 5 are divided by the laser light after the upper portion 8A of the dividing groove 8 is formed in the metal stabilizing layer 7, as the division proceeds, the constituent elements of the oxide superconducting layer 6 and the constituent elements of the cap layer 5C as a main component are divided or fusion-cut and are removed.

Therefore, the coating layer 9 in which the constituent elements of the oxide superconducting layer 6 and the constituent elements of the cap layer 5C are mixed with each other is formed on both inner wall portions of the dividing groove 8. In addition, the oxide superconductor A having the filament conductors 10 having the sectional structure illustrated in FIG. 2 can be manufactured.

As the number of cutting operations performed by the laser, an arbitrary number of two or more may be employed. In a case where a Cu stabilizing layer is provided on the Ag stabilizing layer as the stabilizing layer, the groove cannot be formed to reach the intermediate layer 5 only by two cutting operations, and thus the number of cutting operations is increased. In addition, the thickness of the metal stabilizing layer 7 made of Ag and the thickness of the oxide superconducting layer 6 may vary depending on the specification of the superconductor, and thus the number of cutting operations is not limited to two and an arbitrary number of cutting operations corresponding to the thickness of each layer may be selected. Therefore, in a case where the metal stabilizing layer 7 made of Ag is thick, the stabilizing layer 7 made of Ag is cut into an intermediate depth by a first cutting operation. In a second cutting operation, the cutting is performed on the oxide superconducting layer 6 over the metal stabilizing layer 7. Furthermore, in a third cutting operation, a process of cutting the oxide superconducting wire B into an appropriate depth depending on the thickness of each layer, such as cutting the cap layer 5C is repeated. By performing a necessary number of cutting operations on the oxide superconducting wire B, the dividing groove 8 having a depth that reaches the inside of the cap layer 5C can be formed.

The mixed molten material formed of the constituent elements of the oxide superconducting layer 6 and the constituent elements of the cap layer 5C is a material having excellent electrical insulation. Therefore, as illustrated in FIG. 2, as long as the structure in which both wall portions of the dividing groove 8 are covered with the coating layer 9 having high insulation resistance and the constituent elements of the cap layer 5C are allowed to be present at the bottom surface of the dividing groove 8 is employed, high insulation resistance can be ensured between the filament conductors which are adjacent to each other on both sides of the dividing groove 8 with the dividing groove 8 interposed therebetween. For example, the oxide superconductor A having the filament conductors 10 which have an high insulation resistance such as 10 kΩcm or more at room temperature, preferably 8 MΩcm or more at room temperature, and more preferably 20 MΩcm or more at room temperature can be manufactured.

The oxide superconductor A having the multi-filament structure manufactured as described above has high insulation resistance between the filament conductors which are adjacent to each other with the dividing groove 8 interposed therebetween, and thus becomes an excellent oxide superconductor A having low AC loss due to an effect of dividing the oxide superconducting layer 6 into a plurality of filament conductors 10.

In addition, since the dividing grooves 8 are formed only by the division process using the laser light in the ultraviolet region without using chemical etching, the shape accuracy of the dividing groove 8 is high, and the dividing groove 8 having a width in a range of 5 μm to 100 μm can be formed with high accuracy. In addition, since chemical etching is not used, the side edge portion of the dividing groove 8 is not over-etched, and the filament conductor 10 comes in close contact with the substrate 2. Therefore, the oxide superconductor A provided with the filament conductors 10 having high peel strength can be provided.

Furthermore, since the plurality of filament conductors 10 are formed only by the irradiation of the laser light in the ultraviolet region and a heating process (400° C. to 600° C.) as described in Patent Document 1 is not performed, the properties of the oxide superconducting layer 6 that forms the filament conductors 10 are not deteriorated. Therefore, the oxide superconductor A which has the plurality of filament conductors 10 having excellent superconducting properties and has low AC loss can be provided.

EXAMPLES

Hereinafter, the present invention is described in more detail with reference to Examples, and the present invention is not limited to Examples.

Example 1

A tape-shaped oxide superconducting wire in which, on a tape-shaped substrate which was made of HASTELLOY C-276 (trade name of Haynes International, Inc., US) and had a width of 5 mm, a thickness of 0.1 mm, and a length of 5 m, an anti-diffusion layer (a thickness of 50 nm) made of $Gd_2Zr_2O_7$, an MgO textured layer (a thickness of 5 nm) which was formed by an ion beam-assisted deposition method, an $LaMnO_3$ layer (a thickness of 5 nm to 8 nm) formed by a sputtering method, a cap layer (a thickness of 500 nm) formed of a $CeO_2$ layer by a PLD method, an oxide superconducting layer (a thickness of 1.4 μm) made of a $GdBa_2Cu_3O_x$ layer, and a metal stabilizing layer (a thickness of 6 to 8 μm) made of Ag were formed was prepared.

Next, a laser-processing apparatus having the configuration illustrated in FIG. 4 was used, and an excimer pulsed laser (KrF of 248 nm, a frequency of 200 Hz) was used as a processing laser light source. Moreover, by using an optical mask, a laser light irradiation region of the excimer pulsed laser was shaped into a rectangular shape for use. Adjustment was performed so that a beam shape had a size of 25 μm×500 μm on the surface of the metal stabilizing layer of the oxide superconducting wire to be processed. In addition, a movement speed of the laser light when the oxide superconducting wire is irradiated with the laser light was set to 25 m/h.

For the above-described oxide superconductor, the laser irradiation position was moved little by little while emitting the laser to form the rectangular beam irradiation region described above, and in the meanwhile, cutting work was performed on the oxide superconducting wire in the longitudinal direction thereof using the laser light. In a first laser irradiation operation, an upper portion of a dividing groove which divided the metal stabilizing layer was formed. In a second laser irradiation process, a lower portion of the dividing groove was formed so as to form a groove having a depth that reached the cap layer and divides the oxide superconducting layer, thereby forming filament conductors.

Figure 7:
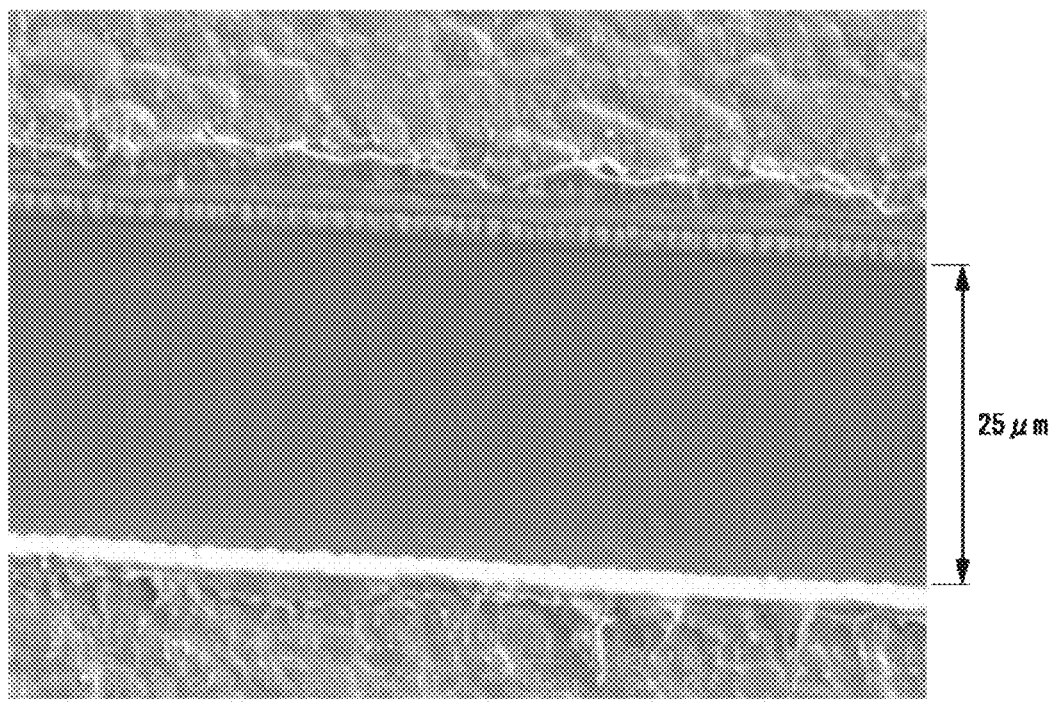
FIG. 7 is an electron micrograph showing an example of a dividing groove formed in an oxide superconducting wire in Examples.

FIG. 7 shows an electron micrograph of the oxide superconductor after the dividing groove was formed. The groove width of the dividing groove in FIG. 7 is 25 μm. In addition, in FIG. 7, portions where cutting deposits remain can be seen from both side portions of the dividing groove, and thus the width of the dividing groove excluding the portions where the deposits remain is 25 μm.

It can be seen from the photograph of FIG. 7 that the dividing groove having a width of 25 μm is formed as desired. Since the cutting was performed by the laser beam which forms a rectangular beam irradiation region, a large number of streaky processing traces could be seen in the groove in the width direction of the groove. As the processing result, the resistance between the filament conductors which became separated by the dividing groove was approximately 8 MΩ (room temperature). Therefore, a good insulation state between the filament conductors could be achieved.

Example 2

As an example in which a laser in the ultraviolet region is used, cutting work was performed on an oxide superconducting wire by using an excimer pulsed laser KrF having a wavelength of 248 nm. As another example, cutting work was performed on the oxide superconducting wire by using a YAG pulsed laser having a wavelength of 266 nm. All of the lasers produced a laser irradiation region having a rectangular intensity distribution through an optical mask, and cutting work was performed on the oxide superconducting wire having a metal stabilizing layer made of Ag by using the laser irradiation region.

Figure 6:
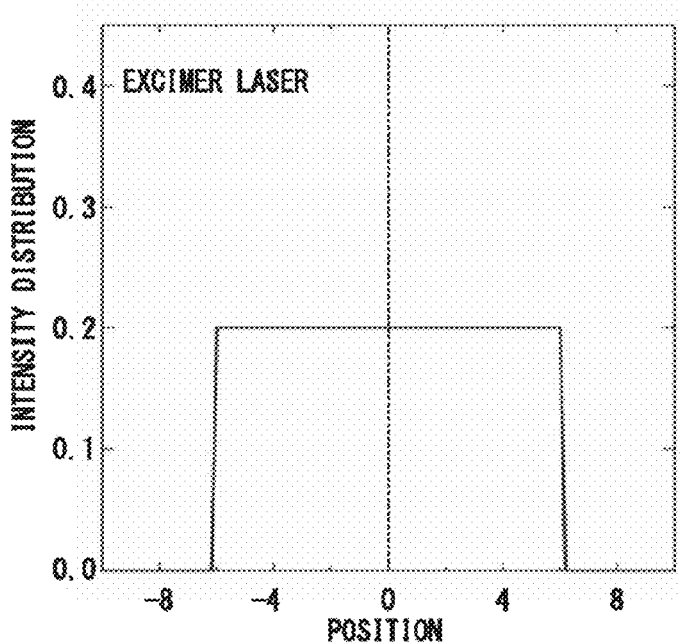
FIG. 6 is a view illustrating a beam intensity distribution of the laser used to form the dividing grooves according to the embodiment of the present invention.
Figure 6:
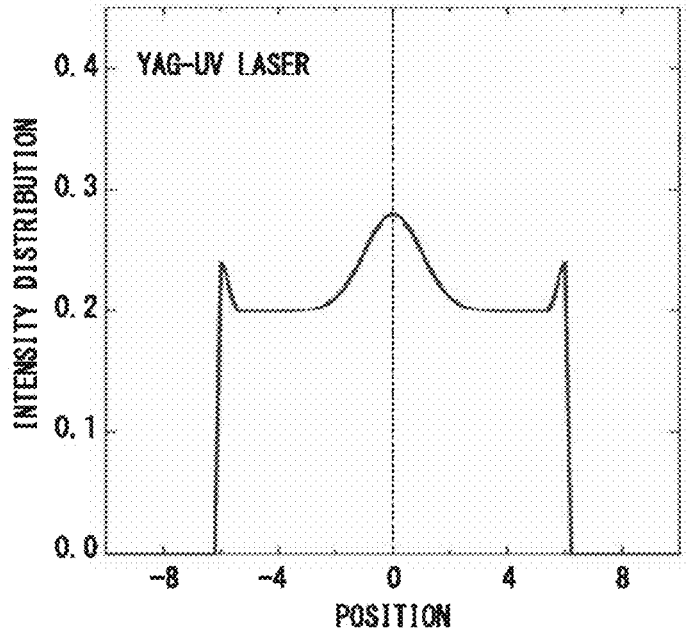

Here, the length of a short side of the rectangular excimer laser was 50 μm. In addition, the length of a short side of the fourth harmonic (266 nm) YAG pulsed laser was 20 μm. In a case of using the excimer laser, the power intensity distribution of the laser light shows a rectangular shape as the processing proceeds as illustrated in FIG. 6(*a*). In addition, in a case of using the YAG laser, in the power intensity distribution of the laser light, as the processing proceeds, a Gaussian component is shown at the center of the power intensity distribution as illustrated in FIG. 6(b). Furthermore, light due to a coherent component is generated in the end part of the power intensity distribution, and thus there is difficulty in controlling the cutting depth. That is, in a case where cutting was performed by using the YAG laser, the oxide superconducting wire was partially deeply cut in the laser irradiation region, and the bottom portion of a dividing groove was not formed so as to be positioned in a portion of a cap layer but the dividing groove was formed into a depth that reached a substrate.

As a result, dross containing the components of the substrate remained in the bottom portion of the dividing groove, and thus the resistance between filament conductors was 2 Ωcm (room temperature), resulting in a structure in which the filament conductors which were adjacent to each other with the dividing groove interposed therebetween were electrically connected to each other. When the I-V characteristics (current-voltage characteristics) of an oxide superconductor were measured, as a result, current redistribution could be observed. Therefore, when the dividing grooves were formed in an oxide superconducting layer by using the fourth harmonic YAG laser, there was a possibility that some of the filament conductors might be connected to each other, resulting in a state in which a reduction in AC loss could not be realized. Therefore, in a case of forming the dividing grooves in the oxide superconducting layer by using the YAG laser, it was found that the power intensity distribution of the laser light needs to have a top-hat shape.

Contrary to this, in an oxide superconductor in which dividing grooves were formed by using the excimer laser to divide an oxide superconducting layer and form filament conductors, approximately 20 MΩcm (room temperature) was obtained as the resistance between the filament conductors with the dividing groove interposed therebetween, thereby achieving an extremely proper insulation state.

As the reason why the high-output pulsed lasers in the same ultraviolet region show differences, the following reason is thought. Since the excimer laser is a gas laser, the excimer laser is a laser having low interference and a non-polarized state. On the other hand, since the fourth harmonic YAG laser is a solid-state laser, the YAG laser has a polarized state in which phases are extremely aligned. Therefore, it is thought that the reason is that the intensity of the Gaussian component of the laser beam center of the fourth harmonic YAG laser is high. In addition, the excimer laser exhibits an action of decomposing a material by breaking the molecular bond of the material. The excimer laser needs a lower amount of decomposition heat than that of the fundamental mode YAG laser which performs fusion cutting through thermal fusion. Therefore, it is thought that in the case of using the excimer laser, a dividing groove having a structure in which the groove bottom portion thereof is positioned in a cap layer can be formed. In addition, it is thought that even the fourth harmonic YAG laser can be applied to the formation of the dividing grooves when the beam intensity is adjusted to the top-hat shape illustrated in FIG. 6(a).

Figure 8:
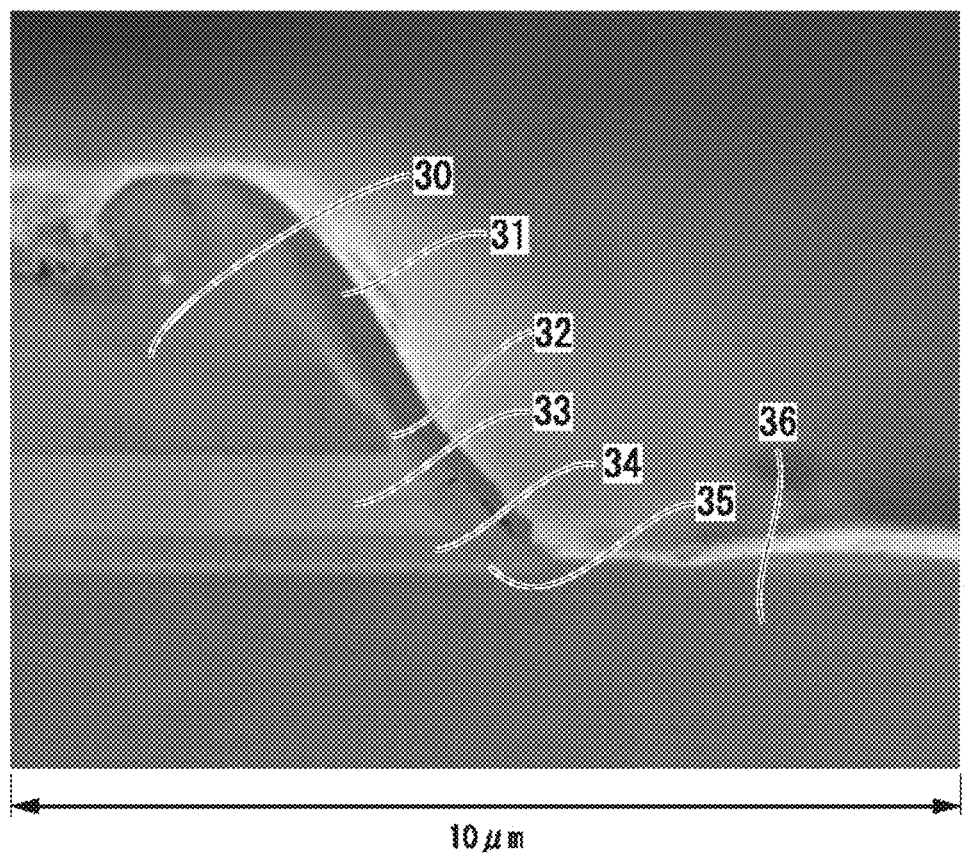
FIG. 8 is an enlarged photograph partially showing a sectional structure of the dividing groove in Examples.

FIG. 8 illustrates a photograph of the sectional structure of an oxide superconductor in which the dividing groove having a depth that reaches the cap layer is formed on the oxide superconducting wire by using the excimer laser.

FIG. 8 is an enlarged view of the sectional structure of one side surface of an inner wall portion which is inclined in a transverse section of the dividing groove.

In FIG. 8, reference numeral 30 represents a portion of the metal stabilizing layer made of Ag, reference numeral 31 represents a portion of a coating layer, and reference numeral 32 represents a portion of the metal stabilizing layer made of Ag which partially covers an end surface of the oxide superconducting layer having a composition of $GdBa_2Cu_3O_x$ denoted by reference numeral 33. Reference numeral 34 represents the cap layer, reference numeral 35 represents an IBAD-MgO layer and a $Gd_2Zr_2O_7$ layer under the cap layer 34, and reference numeral 36 represents the substrate.

From the photograph of the sectional structure illustrated in FIG. 8, it can be seen that a portion of the metal stabilizing layer 30 made of Ag, which faces the dividing groove, covers a portion of the end surface of the oxide superconducting layer which faces the dividing groove, and the coating layer 31 also covers the portion coated with the metal stabilizing layer 30. In addition, it is determined that the bottom portion of the coating layer 31 is coated with the cap layer which is exposed to the bottom portion of the dividing groove. Moreover, it is apparent from the test results of Examples, which will be described later, that the coating layer 31 is mainly formed of the constituent elements of the oxide superconducting layer 33 and the constituent elements of the cap layer 34.

Comparative Example

In order to manufacture a rare-earth-based oxide superconductor having a multi-filament structure, dividing grooves were formed in the above-described oxide superconducting wire by using a laser scribing method having a combination of laser irradiation with controlled output and chemical etching in two stages. The laser scribing method combined with the chemical etching will be described as follows. After the surface of the oxide superconducting wire was cleaned, a mask was applied thereto, and a laser was emitted thereto to partially remove and clean the mask. Thereafter, a metal stabilizing layer made of Ag was etched by using a mixed liquid in which a 35 wt % solution of hydrogen peroxide and 30 wt % of aqueous ammonia are mixed at a ratio of 1:1 (volume ratio). Subsequently, an RE123-based oxide superconducting layer was etched by using a solution of ceric ammonium nitrate to form the dividing grooves, and the mask material was removed in the method.

Figure 9:
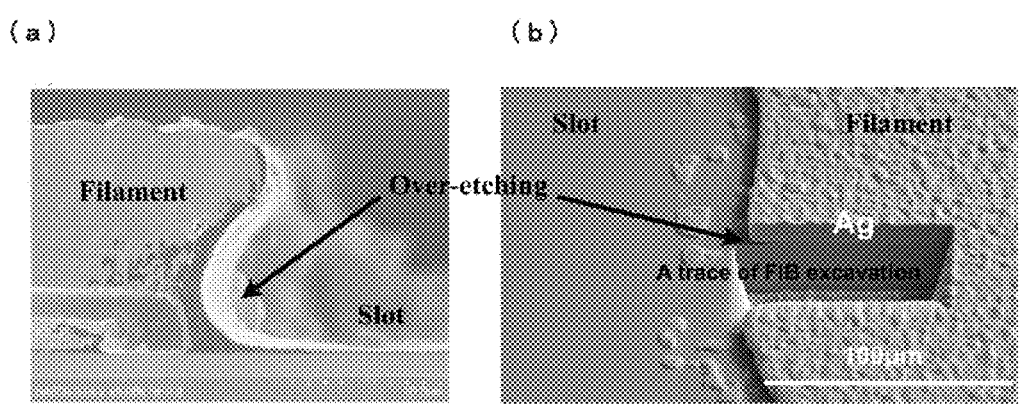
FIG. 9 is an enlarged photograph showing an over-etched portion formed in an oxide superconductor having a dividing groove obtained by etching in Comparative Example and the over-etched portion.

FIG. 9 shows an electron micrograph of the dividing groove obtained by the laser scribing method performed with the chemical etching. In FIG. 9, a portion denoted by "Slot" represents the dividing groove, a portion denoted by "Filament" represents a filament conductor, and a portion denoted by "Over-etching" and indicated by arrows represents an over-etched portion.

In a case where the dividing groove is formed by etching as illustrated in FIG. 9, the over-etched portion is generated so as to increase the groove width of the dividing groove. Therefore, it can be seen that in this example, the shape accuracy of the dividing groove is poor. In addition, when bending stress or the like is applied to the oxide superconductor in which the over-etched portion is generated as described above, the filament conductor is easily peeled off from the over-etched portion as the origin, and thus there is a problem in that the oxide superconductor having low peel stress is produced. When liquid nitrogen for cooling infiltrates into the over-etched portion and expands, there is concern that the peel strength may be reduced, and when moisture infiltrates into the over-etched portion and expands, there is concern that a reduction in the peel strength may occur.

Contrary to this, in the structures of Examples 1 and 2, chemical etching is not performed, and thus an oxide superconductor having high peel strength can be provided.

Example 3

A critical current (Ic) reduction ratio of the oxide superconductor processed by using the excimer laser was tested.

An oxide superconductor (multi-filament wire) having a 10-division structure was formed by applying a method of forming dividing grooves in an oxide superconducting wire having a width of 5 mm and having an Ag metal stabilizing layer formed on an oxide superconducting layer, by using an excimer laser. In this example, filament conductors at both ends of the oxide superconductor in the width direction thereof are not included in the 10-division structure, and thus a structure divided into 12 sections (a structure having 12 filament conductors) was practically employed. Adjustment was performed so that a beam generates a rectangular irradiation region having a size of 50 µm×500 µm on the surface of the oxide superconductor as the intensity distribution of laser light by using an excimer pulsed laser KrF having a wavelength of 248 nm. Therefore, the dividing groove having a groove width of 50 µm was formed in the oxide superconductor.

The I-V characteristics of a plurality of the divided filament conductors were measured, and critical current (Ic) was obtained from the I-V characteristics. In a sample of this example, since the dividing groove has a groove width of 50 µm, the area reduction ratio (which is the ratio of the area of the oxide superconducting wire reduced by forming the dividing grooves, the critical current (Ic) decreases in proportion to the area reduction ratio) was 18%, and the ratio of a reduction in the sum of critical currents of the 10 filament conductors was 22%. Therefore, a deterioration ratio of Ic due to the processing could be suppressed to 4%. The critical current values of the 10 superconducting filaments in this example were as follows.

f1:12.94 A, f2:12.83 A, f3:12.65 A, f4:12.62 A, f5:12.61 A, f6:13 A, f7:12.83 A, f8:12.16 A, f9:11.03 A, and f10: 10.17 A.

Contrary to this, the processing deterioration ratio (Ic reduction ratio due to processing) of the oxide superconductor (the oxide superconductor obtained by the laser scribing method performed with the chemical etching) of Comparative Example illustrated in FIG. 9 was 20% to 30%. Therefore, it could be seen that the oxide superconductor obtained in the processing method performed by using the excimer laser can suppress the processing deterioration compared to the oxide superconductor obtained by etching.

In addition, the resistance between the filaments of the oxide superconductor obtained in Example 3 was measured as follows.

The f1-to-f2 resistance was 27.0 MΩcm, the f2-to-f3 resistance was 33.8 MΩcm, the f3-to-f4 resistance was 364.5 MΩcm, the f4-to-f5 resistance was 5.78 MΩcm, the f5-to-f6 resistance was 30.9 MΩcm, the f6-to-f7 resistance was 39.0 MΩcm, the f7-to-f8 resistance was 40.5 MΩcm, the f8-to-f9 resistance was 1 MΩcm, the f9-to-f10 resistance was 5.08 MΩcm, and the average filament-to-filament resistance was 60.7 MΩcm (all of the resistances are results measured at room temperature).

From the above measurement results, it was found that, by forming the dividing grooves in the oxide superconductor using the excimer laser, and forming the filament conductors which are divided by the plurality of dividing grooves, the oxide superconductor in which the resistance between the adjacent filament conductors is 1 MΩcm or more and thus the insulation resistance is high can be manufactured. In this example, specifically, a resistance of 1 MΩcm or more and 364.5 MΩcm or less could be obtained as the resistance between the adjacent filament conductors.

Example 4

The hysteresis loss of the oxide superconductor which was processed by using the excimer laser was measured.

In order to measure a change in the AC loss in the oxide superconductor having the multi-filament structure, an oxide superconductor in which only a center portion having a length of 4.8 m in the longitudinal direction had a 10-division structure was manufactured from the above-described oxide superconductor having a width of 5 mm and an overall length of 5 m, and a change in the hysteresis loss thereof was measured.

Figure 10:
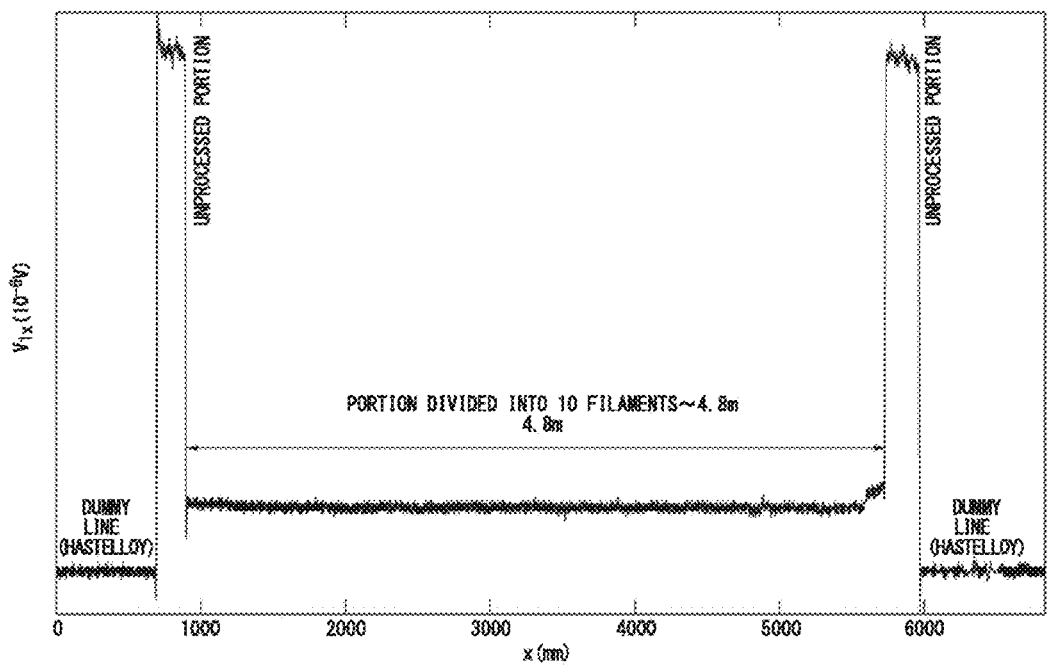
FIG. 10 is a graph showing results of measurement of hysteresis loss in an example of an oxide superconductor obtained in Examples.

The result of measurement of the hysteresis loss of the oxide superconductor having a length of 5 m by a pick-up coil method is shown along the longitudinal direction in FIG. 10.

As shown in FIG. 10, the hysteresis loss of the portion which had the 10-division structure and a length of 4.8 m was approximately 1/10 of the hysteresis loss of a portion which did not have a division structure.

Most of the AC loss of the oxide superconductor is hysteresis loss, and thus the result shown in FIG. 10 may be thought as a change in AC loss. It can be seen that the AC loss of the portion which is formed to have a multi-filament structure of the 10-division structure can be reduced to approximately 1/10 compared to the unprocessed portions of both ends of the oxide superconductor.

Example 5

A case where an oxide superconducting wire with stabilizing copper was formed to have a multi-filament structure by using an excimer laser was tested.

In a method in the related art in which a chemical etching method is used, an appropriate etchant for etching the oxide superconducting wire with stabilizing copper is not developed in the current situation. Therefore, in the related art, it was impossible to form an oxide superconductor in which a Cu metal stabilizing layer is laminated on an Ag metal stabilizing layer to have a multi-filament structure.

However, in the method in which the excimer laser is used and the chemical etching is not performed, physical processing is performed, and thus it can be realized that the oxide superconducting wire with stabilizing copper can be formed to have the multi-filament structure.

In the oxide superconducting wire in which a second metal stabilizing layer which was made of Cu and had a thickness of 20 µm was laminated on a first metal stabilizing layer which was made of Ag and had a thickness of 10 µm, dividing grooves were formed by using the excimer laser under the same conditions as those of the above-described examples.

As a result, the groove bottom surface of the dividing groove could be formed to be flat with a precision of ±0.5 µm in the oxide superconductor. Accordingly, it can be proved that the dividing groove can be formed at the position of a cap layer in the oxide superconducting wire with the stabilizing copper. Therefore, it becomes apparent that an oxide superconductor having a multi-filament structure and low AC loss can be manufactured as in the above-described examples.

Example 6

Figure 11:
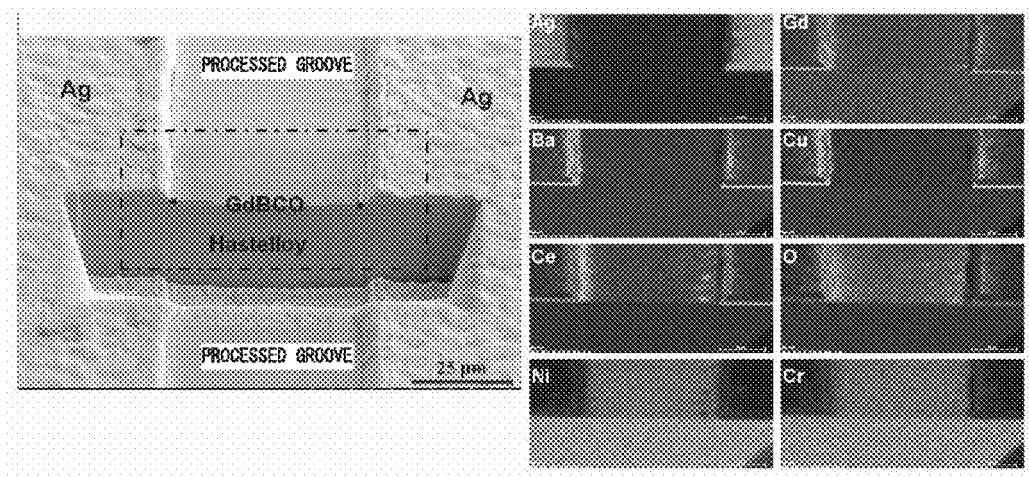
FIG. 11 is an explanatory view showing results obtained by cutting a sample for observing a section of a filament in the periphery of a dividing groove using a focused ion beam (FIB) device from a portion of the dividing groove in another example of the dividing groove formed in the oxide superconductor of Examples, and analyzing the cut sample using an electron probe micro analyzer (EPMA).

A section observation sample of a filament in the periphery of the dividing groove was cut from the oxide superconductor manufactured in Example 1 by using a focused ion beam (FIB) device, and was analyzed as illustrated in the photograph of FIG. 11 using EPMA. Portions denoted by processed grooves illustrated in the photograph of FIG. 11 correspond to the dividing grooves, and portions denoted by Ag represent the portions of the metal stabilizing layer. A portion denoted by Hastelloy (trade name of Haynes International, Inc., US) represents the substrate, and a portion which is denoted by GdBCO and indicated by arrows corresponds to the oxide superconducting layer.

On the right of the photograph of FIG. 11, element analysis results (results from the analysis of each of elements Ag, Gd, Ba, Cu, Ce, O, Ni, and Cr) of a portion of the dividing groove (processed groove) are shown.

From the element analysis results shown in FIG. 11, it can be seen that Gd, Ba, Cu, Ce, and O are present in both inner wall portions of the dividing groove. Regarding the analysis result of Ce, Ce is viewed over the entire surface in the dividing groove. Since EPMA is information gathered from secondary electrons generated by electrons that infiltrate into a depth of several μm, Ni and Co inside the dividing groove are also detected even when Ce is present on the surface. In addition, regarding the inner bottom surface of the dividing groove, Cu is not detected while Ce is detected. This means that the inner bottom surface (outermost surface) of the dividing groove is formed of $CeO_2$. In addition, regarding the analysis results of Gd, Ba, Cu, and Ce, in the right and left inner wall portions of the dividing groove, the right inner wall portion is illustrated thinner than the left inner wall portion. This is because an analysis method which is typically used for the analysis of a flat surface portion is applied to grooves, and thus it becomes difficult to observe (difficult to detect) one inner wall portion depending on the position of the detector.

From the above results, it was determined that Gd, Ba, Cu, and O which are the constituent elements of the oxide superconducting layer are present in both inner wall portions of the dividing groove, and Ce and O which are the constituent elements of the intermediate layer are also present therein.

From this, it could be seen that the coating layers of both inner wall portions of the dividing groove are formed of the constituent components of the oxide superconducting layer and the cap layer, and the inner bottom surface of the dividing groove is formed of $CeO_2$.

Example 7

Portions of the oxide superconductors having a width of 5 mm and the 10-division structure manufactured in Example 1 and Comparative Example were cut, and the peel strength of each of the oxide superconductors was measured. In addition, for comparison, the peel strength of a sample obtained by performing laser irradiation and etching on an oxide superconductor manufactured by a metal-organic deposition (MOD) method instead of the PLD method that was performed to form the cap layer, was measured.

In the oxide superconductor manufactured by the MOD method, layers from a substrate to a cap layer were formed in the same manner as those of the oxide superconductor of Example 1, and an oxide superconducting layer was formed to have a thickness of 1.4 to 1.6 μm. Furthermore, in the oxide superconductor manufactured by the MOD method, a plurality of samples including a sample in which an Ag metal stabilizing layer having a thickness of 5 μm was formed as an Ag metal stabilizing layer and a sample in which an Ag metal stabilizing layer having a thickness of 10 μm was formed were tested. The oxide superconducting layer manufactured by the MOD method is an oxide superconducting layer having a composition of $YBa_2Cu_3O_{7-x}$ manufactured by applying a gel-like film formed of yttrium trifluoroacetate, barium trifluoroacetate, and copper trifluoroacetate (a portion of Cu was substituted with octylic acid) onto a cap layer and thereafter performing preliminary sintering, main sintering, and an oxygen annealing treatment thereon.

Figure 12:
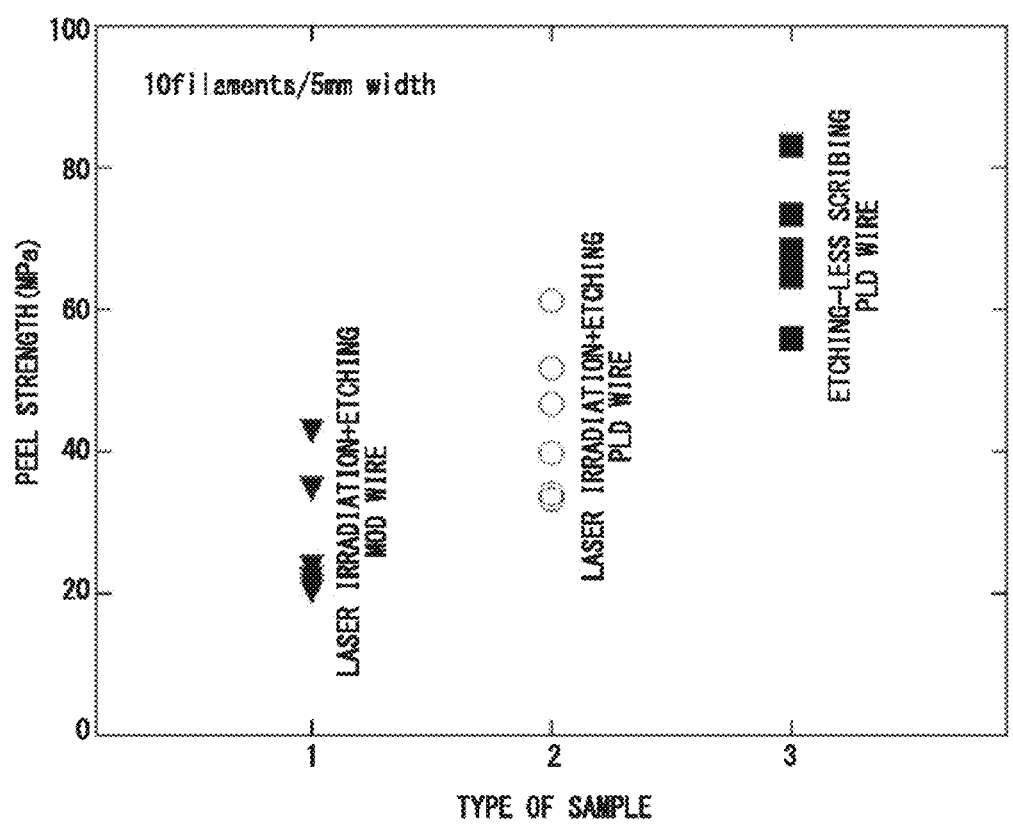
FIG. 12 is a graph showing the comparison between the peel strength of an example sample of (Sample No. 3) of the oxide superconductor obtained in Examples and the peel strength of samples (Sample Nos. 1 and 2) of the oxide superconductor obtained by etching in Comparative Example.

As illustrated in FIG. 12, the peel strength of the oxide superconductor formed by etching-less scribing for forming the dividing groove using the excimer laser was improved. After the scribing for forming the dividing groove by the excimer laser, the peel strength as a strength obtained from an area excluding the area of the dividing groove was 62 MPa to 93 MPa. On the other hand, the peel strength of the oxide superconducting wire before processing is 60 MPa to 90 MPa. Therefore, it was determined that the peel strength after forming the dividing groove in the scribing for forming the dividing groove using the excimer laser was rarely degraded.

From this result, it was determined that after considering a reduction in area due to the formation of the dividing groove in the oxide superconducting wire in which the dividing groove was formed by the scribing in which the dividing grooves are formed using the excimer laser, the peel strength could be maintained at a level of 60% to 100% of the peel strength before the formation of the dividing groove.

INDUSTRIAL APPLICABILITY

The present invention relates to a technique in which a multi-filament type oxide superconductor having low AC loss can be obtained.

DESCRIPTION OF REFERENCE NUMERAL

A oxide superconductor
B oxide superconducting wire
C laser-processing apparatus
2 substrate
5 intermediate layer
5A anti-diffusion layer
5B textured layer
5C cap layer
6 oxide superconducting layer
6a end surface
7 metal stabilizing layer
7a end surface
8 dividing groove
8a bottom portion (groove bottom portion)
8b opening portion
8e inner edge portion
9 coating layer
9a upper portion
9b lower portion
15 laser-generating device
16 cylindrical guiding portion 17 nozzle body
18 assist gas supply source
19 lens device
20 optical device

The invention claimed is:

1. An oxide superconductor, comprising:

a substrate made of a metal;

an insulating intermediate layer provided on the substrate;

an oxide superconducting layer provided on the intermediate layer;

a metal stabilizing layer provided on the oxide superconducting layer; and a plurality of dividing grooves which divide the metal stabilizing layer and the oxide superconducting layer along a longitudinal direction of the substrate, the dividing grooves reaching an inside of the intermediate layer through the oxide superconducting layer from the metal stabilizing layer, the dividing grooves not reaching the substrate, wherein the metal stabilizing layer and the oxide superconducting layer are divided to form a plurality of filament conductors by the plurality of dividing grooves, wherein in each dividing groove of the plurality of dividing grooves, a width of a groove opening portion of the dividing groove is equal to or greater than a width of a groove bottom portion of the dividing groove, wherein the intermediate layer includes a textured layer having a high crystal orientation and a cap layer formed on the textured layer, wherein the groove bottom portion is formed to be positioned inside the cap layer, and wherein the dividing groove is formed to expose a portion of the cap layer from the groove bottom portion.

2. The oxide superconductor according to claim 1, wherein the dividing groove is formed by laser irradiation so that a groove wall portion of the dividing groove is covered with an insulating coating layer formed of constituent elements of the intermediate layer and the oxide superconducting layer, and the coating layer and the groove bottom portion have insulating properties.

3. The oxide superconductor according to claim 1, wherein a groove width of the groove bottom portion is 5 to 100 μm.

4. The oxide superconductor according to claim 1, wherein, in the plurality of filament conductors, a resistance between the filament conductors which are adjacent to each other with the dividing groove interposed therebetween is 1 MΩ cm or more.

* * * * *